United States Patent
Ota (10) Patent No.: US 9,405,168 B2
(45) Date of Patent: Aug. 2, 2016

(54) METHOD OF FABRICATING WAVELENGTH CONVERSION DEVICE

(71) Applicant: USHIO DENKI KABUSHIKI KAISHA, Tokyo (JP)

(72) Inventor: Keisuke Ota, Yokohama (JP)

(73) Assignee: USHIO DENKI KABUSHIKI KAISHA, Tokyo (JP)

(*) Notice: Subject to any disclaimer, the term of this patent is extended or adjusted under 35 U.S.C. 154(b) by 32 days.

(21) Appl. No.: 14/512,627

(22) Filed: Oct. 13, 2014

(65) Prior Publication Data
US 2015/0109660 A1    Apr. 23, 2015

(30) Foreign Application Priority Data
Oct. 18, 2013 (JP) .................. 2013-217660

(51) Int. Cl.
| | | |
|---|---|---|
| G02F 1/35 | (2006.01) | |
| C30B 33/02 | (2006.01) | |
| C30B 29/30 | (2006.01) | |

(52) U.S. Cl.
CPC .............. *G02F 1/3544* (2013.01); *C30B 29/30* (2013.01); *C30B 33/02* (2013.01); *G02F 2001/3548* (2013.01)

(58) Field of Classification Search
None
See application file for complete search history.

(56) References Cited

U.S. PATENT DOCUMENTS

| | | | |
|---|---|---|---|
| 6,211,999 B1* | 4/2001 | Gopalan | C30B 33/00 359/326 |
| 6,602,558 B1* | 8/2003 | Komeda | G02F 1/3558 117/108 |
| 2009/0022903 A1* | 1/2009 | Suzuki | G02F 1/3558 427/532 |
| 2012/0153190 A1 | 6/2012 | Aono et al. | |

FOREIGN PATENT DOCUMENTS

WO    2011/024392 A1    3/2011

* cited by examiner

*Primary Examiner* — Hemang Sanghavi
(74) *Attorney, Agent, or Firm* — Studebaker & Brackett PC (57) ABSTRACT

Disclosed is a method for fabricating a wavelength conversion device that is capable of suppressing unintended and random polarization reversal due to heating thereby achieving higher wavelength conversion efficiency. The method includes: forming an insulating layer on one place of a crystal substrate naturally and uniformly polarized in a thickness direction; forming an insulating layer pattern with line-and-space by photolithography; then supplying conductive fluid to both planes of the crystal substrate to apply voltage to the crystal substrate, thereby a wavelength conversion device that is periodically polarization-reversed is fabricated. When temperature of the crystal substrate decreases after heating, an ionizer supplies ions to a surface of the crystal substrate, negative ions collect on +z plane, and positive ion collect on −z plane, thereby unintended and random polarization reversal is suppressed.

17 Claims, 6 Drawing Sheets

Decay Time : 2.11sec

FIG. 5B

Decay Time : 3.67sec

FIG. 5A

Decay Time : 5.22sec

FIG. 6

METHOD OF FABRICATING WAVELENGTH CONVERSION DEVICE

FIELD OF THE INVENTION

The present invention relates to a method for manufacturing a wavelength conversion device that may leverage a non-linear optical effect.

DESCRIPTION OF THE RELATED ART

A non-linear optical effect is known as a phenomenon that an induced polarization becomes non-proportional to an incident light electric field when a highly intense (high-intensity) light such as a laser light is incident (emitted) into an object. As one of this kind of non-linear optical effect, a typical non-linear optical effect includes a second harmonic generation that generates a light having half wavelength of an incident wavelength, which is a high prospect as a wavelength conversion technique. For example, the technique that converts an infrared light having a wavelength of 1064 nm wavelength emitted from an infrared semiconductor laser into a green light having a wavelength of 532 nm wavelength, which is half wavelength of the infrared light, is expected for practical use in a field of a projector or the like, due to the fact that a development of the laser light source capable of directly emitting the light in a range of this wavelength band is delayed.

As a device (element) leveraging the non-linear optical effect, the wavelength conversion device (element) is known that generates the second harmonic by using the quasi phase matching (QPM) method. The QPM method is a wavelength conversion method that leverages a polarization reversal (polarization-reversed) crystal in which a direction of a natural (intrinsic or spontaneous) polarization of the non-linear optical crystal having ferroelectric property is alternatively reversed by 180 degree in turn. The QPM method is known as a method that is capable of attaining higher wavelength conversion efficiency with favorable beam quality.

More particularly, lithium niobate ($LiNbO_3$, LN), lithium tantalite ($LiTaO_3$, LT), $KTiOPO_4$ (KTP) or the like are exemplarily known as the non-linear optical crystal. These kinds of crystals, which are the non-linear optical crystals with periodically polarized structures (PP), are denoted as "PPLN (Periodically poled $LiNbO_3$)", "PPLT", "PPKTP" or the like, respectively.

Inter alia, the PPNL crystal in which MgO is doped is known as a crystal that is capable of attaining higher resistance to the light damage (photorefractive damage) with lighter wavelength conversion efficiency.

LISTING OF REFERENCES

Patent Literatures

PATENT LITERATURE 1: PCT International Publication No. WO 2011/024392

SUMMARY OF THE INVENTION

Problem to be Solved

However, in the field of above mentioned fabrication (manufacture) of the wavelength conversion device leveraging the QPM method, it has been turned out that the higher wavelength conversion efficiency can be hardly attained when the fabrication process includes a heating process (step or treatment). Hereinafter, this kind of problem will be explained below.

In order to find out a cause of the above mentioned problem of the wavelength conversion device with lower wavelength conversion efficiency than expected, the inventor of the present invention applied a hydrofluoric acid treatment on a surface of the wavelength conversion device. Applying the hydrofluoric acid treatment causes the surface of the wavelength conversion device to be scraped (shaved). The way of scraping (shaving) differs depending on the direction of the polarization so that it can visualize the polarization structure on particular wavelength conversion device.

Figure 6:
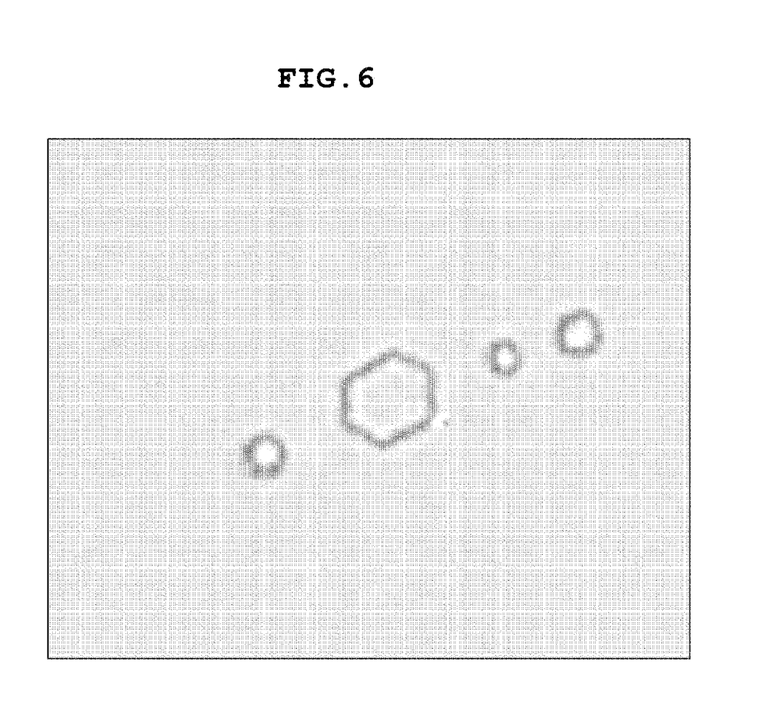
FIG. 6 is a view useful to describe an exemplary result of the selective etching applied to the device in which the expected wavelength conversion efficiency has not been obtained, and a picture of the surface of the device on which the etching treatment is applied.

FIG. 6 shows a result of the hydrofluoric acid treatment to the wavelength conversion device with lower wavelength conversion efficiency than expected, and also shows a picture of the surface of the wavelength conversion device to which the hydrofluoric acid treatment is applied.

As shown in FIG. 6, in the fabricated (manufactured) wavelength conversion device, a plurality of hexagonal patterns of various sizes can be visibly recognized. The patterns show that the wavelength conversion device has a state that is polarized (polarization occurs or is generated) in the different direction from the circumference. The patterns also show the different polarization, which is different from the line-and-space (striped) polarization intended to be formed, is generated (i.e., unintended polarization reversal (reversed polarization.))

Figure 1:
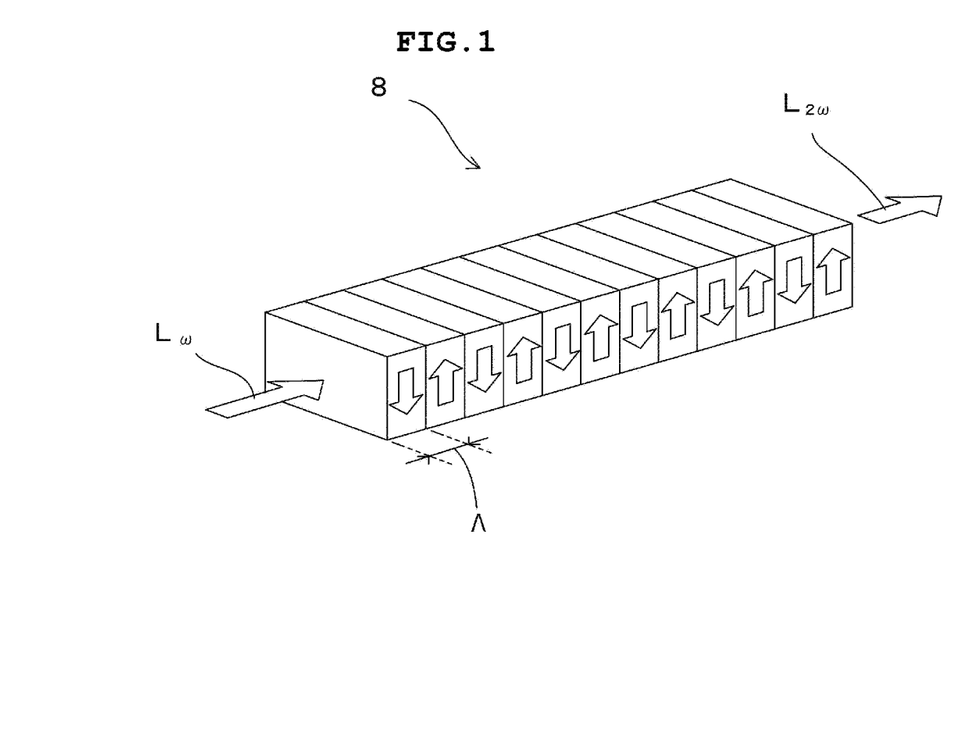
FIG. 1 is a schematic view useful to describe an exemplary perspective view of the quasi phase matching (QFM) type wavelength conversion device fabricated (manufactured) by periodic inverse electric field setting.

Although the periodic polarization reversal structure is not shown due to the limitation on the particular resolution in taking image, it can be observed that the size of the spot like pattern is much more larger than the cycle (pitch) of the polarization reversal (Λ) shown in FIG. 1). As a result, the quasi phase matching (QFM) is not accomplished in the region in which the spot-like pattern is formed (i.e., the region in which unintended and random polarization reversal (polarization reversed region) is generated). Accordingly, the harmonics do not mutually strengthen but rather mutually attenuate (counteract) conversely. Certain numbers of regions in which these kinds of unintended polarization reversal occur can be observed. Resultantly, it is considered that these regions cause the wavelength conversion efficiency to be reduced.

As will be described below, certain method can be employed that periodically applies voltage to intentionally reverse the polarization in order to obtain the periodic polarization reversal (periodically polarization-reversed) structure. If the region with the above spot-like pattern is formed only in the region to which the voltage is applied (i.e., the region in which its polarization is to be intentionally reversed), then it cause no problem in theory, because the polarization in those regions should be intrinsically reversed.

However, this kind of case is extremely rare, because the size of the spot like pattern is much larger than the pitch (cycle) of the polarization reversal (Λ). Even assuming that the size of the spot like pattern is smaller than the pitch (cycle) of the polarization reversal (Λ), still the voltage is not applied. This is because, in the case that the spot like pattern is (unintentionally) formed in the region in which the polarization should not be reversed (i.e., the region in which the natural (spontaneous) polarization should be kept), this portion is covered with insulating layer pattern, as shown in FIG. 2. For this reason, unintentional and random polarization reversal is kept generated so that the quasi phase matching (QPM) is not accomplished to entail reduction in wavelength conversion efficiency.

According to further research conducted by the inventor of the present invention, it has been turned out that this kind of unintentional and random polarization reversal occurs due to a heating process for the crystal substrate, which is carried out during the manufacture (fabrication) of the wavelength conversion device. As will be described below, according to the fabrication method of embodiments of the present invention, the method may include a pre-bake process (treatment) and/or post-bake process (treatment) for the resist. For this reason, the temperature of the crystal substrate is once elevated to the required temperature for heating and then dropped (decreased or lowered). As the crystal substrate is ferroelectric and pyroelectric, it is conceived that the polarization reversal (reversed polarization) in a random manner cannot avoid being generated during the change in temperature. Hereinafter throughout the specification, "randomly" or "in a random manner" means that the generated polarization reversal is not a periodic (regular) polarization reversal, unlike as shown in FIG. 1.

It is presumed that this kind of unintentional and random polarization reversal is generated (occurs) probably in an area in which a crystal defect such as a lattice defect exists. In the area in which the crystal defect exists, much amount of occurrence of the energy levels is observed so that the area is in a high state in energy intrinsically. For this reason, the polarization can be easily vary due to the change in temperature. Accordingly, it is presumed that the random polarization reversal, as shown in FIG. 6, cannot avoid being generated.

The present invention is accomplished (developed) in view of these facts and knowledge, and an object of the present invention is to provide a method of fabricating (manufacturing) a wavelength conversion device that is capable of achieving higher efficiency of wavelength conversion by suppressing the unintentional and random polarization reversal.

Solution to the Problem

In order to solve the above mentioned problem, according to a first aspect of the present invention, there is provided a method of fabricating a wavelength conversion device. The wavelength conversion device is fabricated from a crystal substrate and has a structure that is periodically polarization-reversed in the direction perpendicular to a thickness direction of the crystal substrate formed from a ferroelectric crystal demonstrating a non-linear optical effect. The fabrication method comprises: heating the crystal substrate; and removing electricity on a surface of the crystal substrate when temperature of the crystal substrate being changing due to the heating.

In order yet to solve the above mentioned problem, according to a second aspect of the present invention, the removing electricity may be carried out by collecting, on the surface of the crystal substrate, ions having a polarity different from a polarity on a region of the surface of the crystal substrate in which natural polarization occurs.

In order yet to solve the above mentioned problem, according to a third aspect of the present invention, the removing electricity may be carried out by use of an ionizer.

In order yet to solve the above mentioned problem, according to a fourth aspect of the present invention, the method may further comprises: forming an insulating layer on at least one plane of the crystal substrate; forming a pattern with line-and-space of the insulating layer; and periodically applying voltage to the crystal substrate using the formed pattern with line-and-space of the insulating layer, wherein the heating is carried out after the forming the insulating layer, and before or after the forming the pattern.

In order yet to solve the above mentioned problem, according to a fifth aspect of the present invention, the applying voltage may further comprises: supplying conductive fluid to the crystal substrate in a manner that the conductive fluid contacts a region of the surface of the crystal substrate that is not covered with the insulating layer, the region consisting of each of linear portions constituting the line-and-space; and applying the voltage to the crystal substrate through the conductive fluid.

In order yet to solve the above mentioned problem, according to a sixth aspect of the present invention, the heating may be carried out after forming the insulating layer.

Furthermore, in order yet to solve the above mentioned problem, according to a seventh aspect of the present invention, the removing electricity may be carried out when the temperature of the crystal substrate decreases.

Furthermore, in order yet to solve the above mentioned problem, according to an eighth aspect of the present invention, there is provided a wavelength conversion device fabricated by the above mentioned method of fabricating a wavelength conversion device.

As will be described below, according to the first aspect of the present invention, generation of an unintentional and random polarization reversal may be suppressed when temperature of the crystal substrate changes (is changing) due to heating in the heating step. Accordingly, intentional and periodic polarization structure (polarized structure) can be fabricated (manufactured) in favorable quality. As a result, a desirable wavelength conversion device with higher wavelength conversion efficiency can be obtained.

Further, according to the second aspect of the present invention, in addition to the above mentioned advantageous effect, the unintentional and random polarization reversal is suppressed by ion supply. As a result, the configuration for fabricating the wavelength conversion device can avoid being larger scale, and easier adjustment and control for fabricating the wavelength conversion device can be attained.

Further, according to the third aspect of the present invention, in addition to the above mentioned advantageous effect, the polarization reversals are suppressed on both sides by supplying reversed polarity (reverse polarity) ions from the both sides. As a result, an even higher effect of suppressing the polarization reversal can be obtained.

Further, according to the fourth aspect of the present invention, in addition to the above mentioned advantageous effects, the unintentional and random polarization reversal can be suppressed during a pre-bake treatment (process) or post-bake treatment (process) for the insulating layer. As a result, the fourth aspect of the present invention can be preferably employed for a manufacturing (fabricating) process that requires the pre-bake or post-bake treatment (process).

Further, according to the fifth aspect of the present invention, in addition to the above mentioned advantageous effects, the periodic polarization reversal structure can be manufactured (fabricated) by applying voltage to the crystal substrate by use of the conductive fluid. As a result, the manufacturing process can be simplified.

Yet further, according to the seventh aspect of the present invention, in addition to the above mentioned advantageous effects, the removing electricity (neutralizing or destaticizing) can be carried out when the temperature of the crystal substrate decreases where the unintentional and random polarization reversal is more likely to occur (be generated). As a result, the effect of suppressing the polarization reversal can be obtained in a more assured manner.

These and other objects, aspects and advantages of the present invention will become apparent to a skilled person from the following detailed description when read and understood in conjunction with the appended claims and drawings.

DETAILED DESCRIPTION OF THE INVENTION

Now, embodiments of the present invention (hereinafter referred to as "embodiments") will be described with reference to the accompanying drawings in detail. Here, it should be noted that the present invention is not limited to the illustrated and described embodiments, and the embodiments of the present invention are not limited to the illustrated and described embodiments.

The wavelength conversion device fabricated by the method according to the embodiment is the quasi phase matching (QFM) type wavelength conversion device as described above.

First Embodiment

FIG. 1 is a schematic view illustrating the quasi phase matching (QPM) type wavelength conversion device fabricated with the periodic inverse electric field setting. As recognizable from FIG. 1, the term "periodic" means a periodically intermittent state or condition. In other words, it means that a region in which the inverse electric field is set and a region in which the inverse electric field is not set are brought into an alternatively successive state (in turn) when it is observed from the direction perpendicular to z direction. In this case, the direction perpendicular to z axis is assumed as the incident direction of a fundamental wave $L_\omega$.

In FIG. 1, the polarization structure of the quasi phase matching (QFM) type wavelength conversion device 8 is shown with an arrow directed, for example, from −z side towards +z side. Although a boundary of regions each of which is polarized in different direction each other is shown in solid line in FIG. 1, it should be noted that it does not mean an actual device includes such boundary line. Instead, the solid line in FIG. 1 is a line schematically drawn for better understanding of the polarization structure for illustrating purpose only.

As shown in FIG. 1, it is assumed that the polarizations are periodically reversed and the reversal pitch (cycle) of the polarization (shown in FIG. 1 as Λ) is set to an adequate distance with respect to wavelength of laser light (fundamental wave (harmonic)) $L\omega$. Then, when the laser light $L\omega$ is propagated inside the device along x-y plane, phases of the second harmonics $L_2\omega$ generated in sequence are quasi-matched and are output from the device in a manner that the second harmonics are not mutually attenuated but inversely strengthen each other. Here, the polarization reversal pitch (cycle) Λ can be obtained with the following formula 1 with respect to the wavelength of the fundamental wave (harmonic)) $L\omega$.

$$\Lambda = \frac{m\lambda}{2(n_{2\omega} - n_\omega)} \quad \text{(Formula 1)}$$

In the above formula 1, m denotes a number corresponding to an order (degree) of the harmonic ("1" in the present embodiment), λ denotes a wavelength of the fundamental (reference) wave, $n_\omega$ denotes a refraction index at the wavelength of the fundamental wave, and $n_{2\omega}$ denotes a refraction index at the wavelength of the second harmonic. For example, when the wavelength of the fundamental wave λ is 1064 nm, and the crystal is $LiNbO_3$, then the polarization reversal pitch (cycle) Λ is calculated to be in the vicinity of (approximately) 7 μm.

FIG. 2 is a schematic view illustrating a fabrication method for fabricating this kind of quasi phase matching (QPM) type wavelength conversion device according to the first embodiment. As described above, in order to fabricate the quasi phase matching (QPM) type wavelength conversion device according to the first embodiment, it is necessary in principle to obtain good (favorable) quality non-linear optical crystal having uniform directions of natural polarizations and then to set the periodic inverse electric field to reverse (inverse) polarizations. FIGS. 2A to 2D shows a sequence of procedures.

Setting periodic inverse electric fields may be achieved by causing the electrode to directly contact a surface of the non-linear optical crystal and applying voltage to the surface of the non-linear optical crystal. At this moment, the polarization reversal pitch (cycle) Λ is extremely small in distance. Therefore a fine electrode structure has to be formed. In addition, the formed electrode structure has to be removed ultimately as is not required for the end (final) product.

Taken these requirements into consideration, the manufacturing method according to the first embodiment employs a method of applying voltage with conductive fluid to facilitate fabrication of the wavelength conversion device.

More particularly, it is in principle necessary to obtain the non-linear optical crystal for fabricating the quasi phase matching (QPM) type wavelength conversion device, and slice the non-linear optical crystal in prescribed thickness to allow the non-linear optical crystal to be of plate like shape (hereinafter referred to as "crystal substrate"). The crystal substrate has natural polarizations in a uniform manner. As recognizable from FIG. 2, the crystal substrate may be obtained by slicing the non-linear optical crystal such that the thickness direction of the crystal substrate is z direction.

Figure 2A:
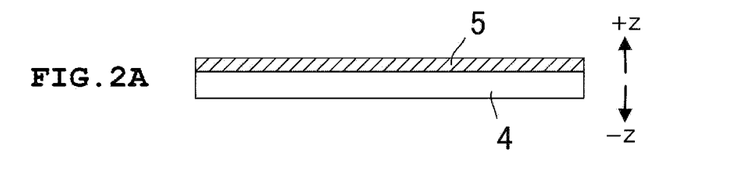
FIG. 2A to FIG. 2D are a series of views useful to describe an exemplary method of fabricating the quasi phase matching (QFM) type wavelength conversion device according to one embodiment of the present invention.

First, as shown in FIG. 2A, an insulating layer 5 is formed on at least one plane (one surface) of the crystal substrate 4. In the first embodiment, the insulating layer 5 is formed by coating the plane of the crystal substrate 4 with the resist having insulating property. Although which plane is to be coated may be arbitrarily selected, FIG. 2A illustrates an example of insulating layer 5 being coated on the plane at +z side. The resist to be coated is a photosensitive material, as it is subject to the photolithography treatment to allow patterns to be formed on the resist.

Figure 2B:
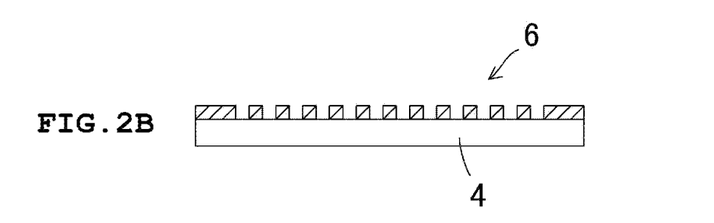

After the insulating layer 5 is formed, the insulating layer 5 is subject to the soft-bake (pre-bake) treatment (processing). Subsequently, patterns are formed on the insulating layer 5 by using photolithography technique (lithographic exposure or image development) to obtain an insulating layer pattern 6 (as shown in FIG. 2B). The formed insulating layer pattern 6 is of a line-and-space like shape. The patterns on the insulating layer are formed in a manner that numerous linear portions (ridge or elongated protrusion) extending in a prescribed direction are formed in parallel at a prescribed distance.

Figure 2C:
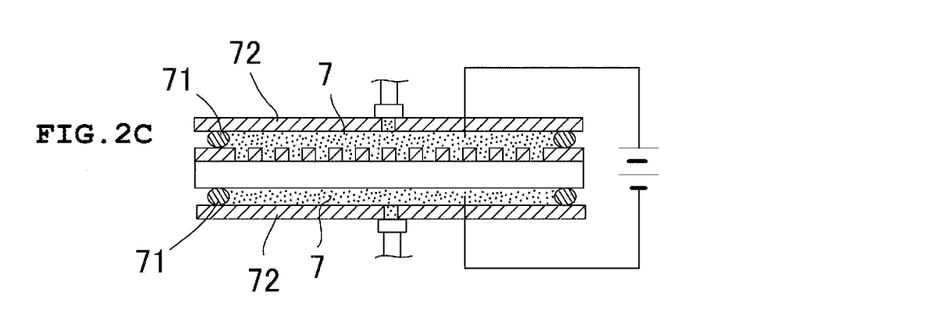

Next, after applying a hard-bake (post-bake) treatment (processing) to the formed insulating layer pattern 6, voltage is applied to the insulating layer pattern 6 with the conductive fluid 7 as shown in FIG. 2C. In other words, as shown in FIG. 2C, the surface at +side of the crystal substrate 4 is enclosed by a sealing ring 71 such as o shaped ring, and the sealing ring 71 is closed (sealed) with a pad 72 provided with an injection hole (pore) to form a closed space between the crystal substrate 4 and the pad 72. Subsequently, the conductive fluid 7 is injected into the formed closed space to fill the space thereof. In this state, positive voltage is applied to the filled conductive fluid 7 within the closed space at +side. On the other hand, the conductive fluid 7 filled within the other closed space at −side is set to an earth potential, or alternatively negative voltage is applied to the filled conductive fluid 7. As an exemplary conducive fluid, for example, lithium chloride solution is in widespread use.

Applying voltage causes the electric field to be set to the crystal substrate 4 in the thickness direction (i.e., z direction). At +z side, positive voltage is applied only to the surface region that is not covered (coated) with the insulating layer pattern 6. For this reason, the polarization in the surface region that is not covered (coated) with the insulating layer pattern 6 is reversed, while in contrast, the polarization in the region that is covered (coated) with the insulating layer pattern 6 is not reversed (i.e., the polarization in the region is kept in the direction of intrinsic (original) natural polarization.) As a result, the periodic polarization reversal (periodically polarization-reversed) structure may be obtained.

Figure 2D:
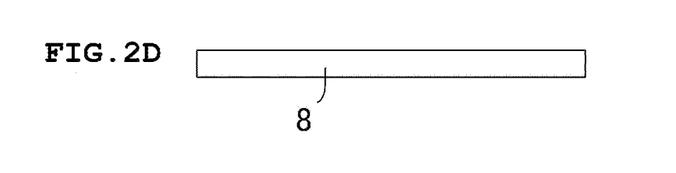

After such periodic polarization reversal structure is formed, the insulating layer pattern 6 is removed and necessary cleaning treatment and an inspection process may be performed. Then the quasi phase matching (QPM) type wavelength conversion device 8 is completed (as shown in FIG. 2D). Although the fabricated device has the same exterior appearance of the crystal substrate 4 as the pre-process crystal substrate 4, an internal polarization structure has a periodic structure as shown in FIG. 1.

During the above mentioned manufacturing (fabricating) process, there may be a case that a plurality of quasi phase matching (QPM) devices 8 are fabricated from a crystal substrate 4. In other words, after processes shown in FIGS. 2A to 2D are carried out, there may be a case that the crystal substrate 4 is cut at prescribed positions into a plurality of quasi phase matching (QPM) devices 8.

In the case that the quasi phase matching (QPM) type wavelength conversion device 8 is fabricated according to the above mentioned method, as described above, it is turned out that the crystal substrate 4 includes (has) the unintentional and random polarization reversal. The inventor of the present invention has been conducting a research to the utmost on a new manufacturing process capable of suppressing the above mentioned unintentional and random polarization reversal. Consequently and ultimately, the inventor of the present invention has reached to conceive and reduction to practice an effective method capable of suppressing the unintentional and random polarization reversal. It should be noted that hereinafter and throughout the specification, suppressing the unintentional and random polarization is referred to as the term "removing electricity", "neutralizing" or "destaticizing". It is also referred to as the term "removing electricity on (from) a surface", "neutralizing a surface" or "destaticizing a surface."

More particularly, according to the method of the present embodiment, when (while) the change in temperature of the crystal substrate 4 is occurring (occurs) during the process such as the post-bake or pre-bake treatment, ions are supplied to a surface of the crystal substrate 4 to suppress the polarization reversal.

Figure 3:
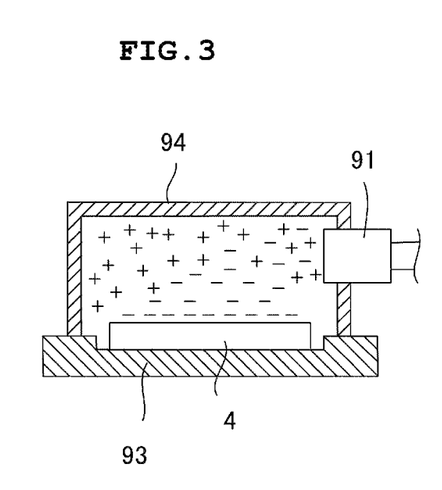
FIG. 3 is a schematic view useful to describe an exemplary front cross-sectional view illustrating the removing electricity (neutralizing or destaticizing) step in the fabricating method according to one embodiment of the present invention.

Now referring to FIG. 3, this mechanism will be described in detail. FIG. 3 is a front cross-sectional view illustrating the neutralization in the manufacturing method according to the first embodiment.

As described above, the unintentional and random polarization reversal occurs while the temperature of the crystal substrate 4 changes (is changing). According to the inventor's research accomplished, in particular, it is presumed that the unintentional and random polarization reversal is more likely to occur when the temperature of the crystal substrate 4 decreases. It suggests that supplying ions (the ion supply) is preferable to be carried out at such moment. According to the first embodiment, during the pre-bake treatment (process) and/or post-bake treatment (process), the crystal substrate 4 is left lying in a heating furnace 9 and then cooled (i.e., natural cooling). For this reason, in the method according to the first embodiment, the heating furnace 9 is provided with an ionizer 91, which supplies ions to the crystal substrate 4 during its temperature being decreasing in the heating furnace 9.

As shown in FIG. 3, in the first embodiment, the heating furnace 9 is provided with a hot plate 93 and a covering member 94. The crystal substrate 4 is configured to be mounted on a tray (hot plate) 93 for heating and then be subject to be the heating process. The crystal substrate 4 is, after the heating by the tray 93 is stopped, naturally cooled on the tray 93. At this moment, the ionizer 91 supplies ions to the surface of the crystal substrate 4. As shown in FIG. 3, the crystal substrate 4 mounted on the tray 93 is covered with the covering member 94. The ionizer 91 is mounted (attached) to the covering member 94 so that the ionizer 91 is configured to supply ions inside the covering member 94.

The ionizer 91 is configured to ionize air (for example, compressed air), and generate the same quantity of positive ion or ions (cation or cations) and negative ion or ions (anion or anions). As shown in FIG. 3, generated ions are irradiated (emitted) from the ionizer 91 and reach to the surface of the crystal substrate 4.

At this moment, the crystal substrate 4 is naturally polarized (has natural polarization), and, in the example in FIG. 3, +z plane (i.e., positive electric charge plane) is upwardly exposed. For this reason, among ions emitted from the ionizer 91, the negative ions aggregate (collect) together on the upper plane (+z plane) of the crystal substrate 4. Accordingly, even when the temperature of the crystal substrate 4 changes (is changing), the undesirable random polarization reversal is suppressed to be generated. In other words, even in the case that crystal defect or the like exists and therefore the polarization reversal is about to occur (locally) at the position of the crystal defect, such polarization reversal may be efficiently suppressed because the negative ions capture (moderate or suppress) the polarization at +z plane.

In general, the hot plate 93 is formed from a conductive material and grounded. The positive ions and excess negative ions emitted from the ionizer 93 flow into the earth (ground) through the hot plate 93.

Second Embodiment

Figure 4:
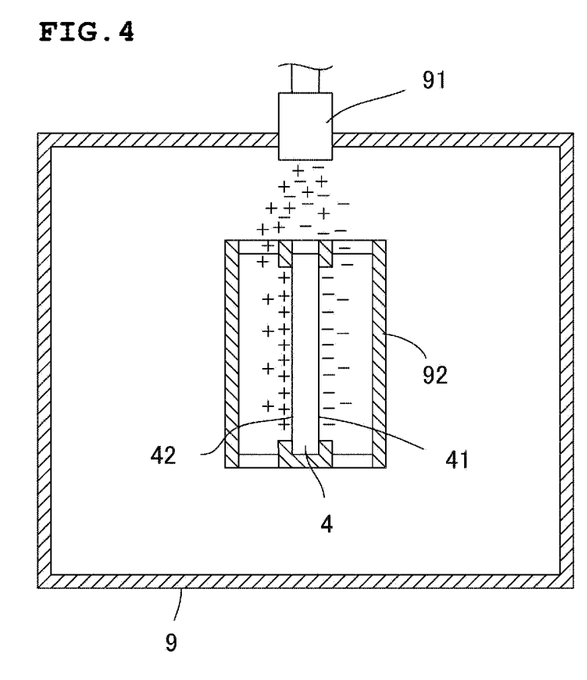
FIG. 4 is a schematic view useful to describe an exemplary front cross-sectional view illustrating the removing electricity (neutralizing or destaticizing) step in a fabricating method according to another embodiment of the present invention.

Next, referring to FIG. 4, the other fabrication method according to a second embodiment will be described below. FIG. 4 is a front cross-sectional schematic view illustrating a manufacturing method according to another embodiment of the present invention. In the second embodiment shown in FIG. 4, an arrangement of the crystal substrate 4 during the removal of electricity is different from the first embodiment. That is, as shown in FIG. 4, the crystal substrate according to the second embodiment is arranged vertically.

More particularly, as shown in FIG. 4, the crystal substrate 4 arranged in a vertically standing manner in the heating furnace 9. The crystal substrate 4 is hold by a substrate holding member 92 such that the vertically standing position (arrangement) of the crystal substrate 4 is kept. The substrate holding member 92 holds the crystal substrate 4 both at an upper end and a lower end of the crystal substrate 4. Thus, the main plane of the crystal substrate 4 (i.e., a plate surface serving as either +z plane or −z plane) becomes in an exposed state. In addition, the ionizer 91 is mounted at the upper section of the heating furnace 9, and the ionizer 91 supplies ions through an upper aperture of the heating furnace 9. As a direction of ion emission (irradiation) from the ionizer 91 is a vertically downward direction, the main plane of the crystal substrate 4 is in parallel to the direction of the ion emission.

As shown in FIG. 4, ions emitted from the ionizer 91 come down on the down blow and reach the surfaces 41 and 42 of the crystal substrate 4. At this moment, the crystal substrate 4 has the natural polarization (is naturally polarized), and one plane of the crystal substrate 4 serves as the +z plane 41 (i.e., a positive electric charge plane) while the other place of the crystal substrate 4 serves as the −z plane 42 (i.e., negative electric charge plane). Accordingly, among ions coming down from the ionizer 91, the positive ions flow to the −z plane 42 side to collect on (in the vicinity of) the −z plane 42, while the negative ions flow to the +z plane 41 to collect on (in the vicinity of) the +z plane 41. As a result, the positive and negative ions collect on (in the vicinity of) the surfaces of the crystal substrate 4, respectively, according to the polarity of the natural polarization of the crystal substrate 4. Consequently, even when the temperature of the crystal substrate 4 changes (is changing), generation of the random polarization reversal can be suppressed, as similar to the first embodiment.

Figure 5A:
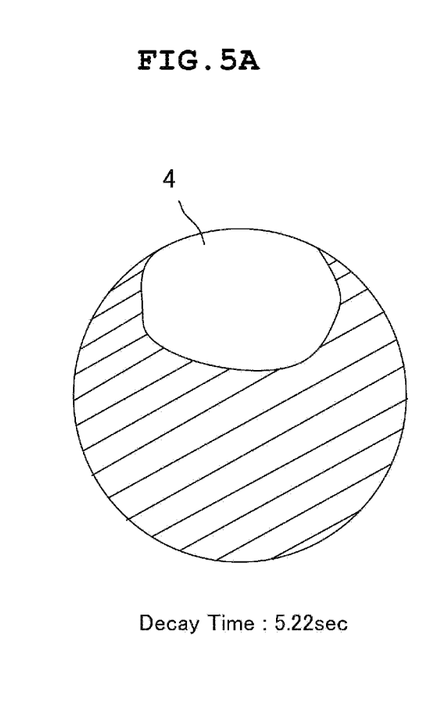
FIG. 5A to FIG. 5C are a series of views useful to describe an exemplary result of the experiment for confirming the effect of suppressing the polarization reversal by ion supply.
Figure 5B:
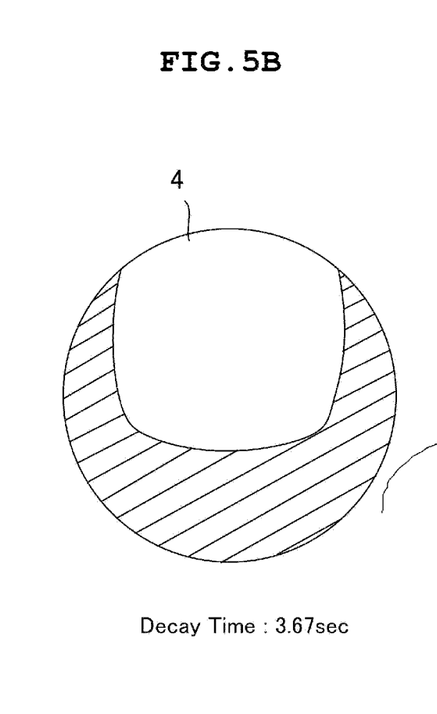
Figure 5C:
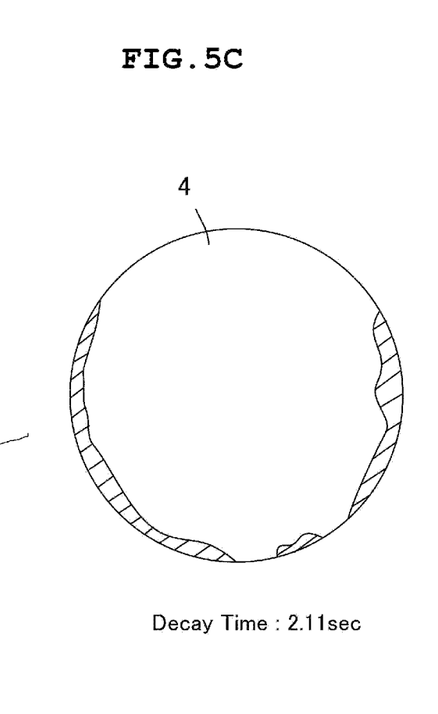

FIG. 5 is a view illustrating an experimental result confirming an effect of suppressing the polarization reversal by use of the ion supply, as described above. In this experimental result, using the Ionizer Model 306, manufactured by Hugle Electronics Inc., and the distance of a region in which the random polarization reversal occurred was observed with changing the ion irradiation level (amount).

This experiment employed the method according to the second embodiment shown in FIG. 4, using the circular crystal substrate 4 ($LiNbO_3$). After the crystal substrate 4 has heated at 125 Celsius degree for approximately two hours, the crystal substrate 4 was left lying in the heating furnace 9 until the temperature of the once heated crystal substrate 4 decreased to the room temperature. In FIG. 5, hatched line area shows an area in which the unintentional and random polarization reversal (i.e., the spot like polarization reversal as shown in FIG. 6) during the temperature drop (decrease).

In FIG. 5, the term "decay time" means a performance of the ionizer (the ion supply quantity), and the shorter the decay time becomes, the larger the ion supply level (amount or quantity) becomes. As shown in FIG. 5, as getting the decay time of the ionizer to be shorter (i.e., as getting the ion supply quantity to be larger), the area in which the random polarization reversal occurs becomes smaller. The area in which the random polarization does not occur extended such that the downward ion stream from upper side spread out the area. It is presumed that the larger amount of ions collecting on the surface allows the area in which the random polarization reversal is suppressed to be expand.

As such, according to the fabrication method of the second embodiment, the unintentional and random polarization reversal may be suppressed when (while) the temperature of the crystal substrate changes (is changing). Accordingly, higher quality quasi phase matching (QPM) wavelength conversion device may be fabricated that is capable of accomplishing higher conversion efficiency.

It should be noted that suppressing the polarization reversal by ion supply on the surface has a significance that the polarization reversal can be suppressed with a simplified configuration (structure) with leveraging the property of the ferroelectric crystal.

As a configuration suppressing the unintentional and random polarization reversal, applying voltage to the crystal substrate with an electrode contacting the crystal substrate may be conceivable. More particularly, the negative voltage is applied to an electrode plate contacting the crystal substrate with covering +z plane thereof, and the positive voltage is applied to another electrode plate contacting the crystal substrate with covering −z plane thereof. Although this kind of configuration may be employable, it may entail the larger size of configuration of the manufacturing equipment (i.e., the configuration for applying voltage). It may also entail further consideration of defining the voltage to be applied in an appropriate manner.

In contrast, according to the second embodiment, employing the above mentioned configuration suppressing the polarization reversal with ion supply does not entail the larger size of configuration of the manufacturing equipment (i.e., the configuration for applying voltage). Also, as the electric charge generated on the surface due to the natural polarization can be mitigated by ions and saturate naturally, easier adjusting and controlling the manufacturing process can be achieved. Here, trying to generally phrase the configuration for supplying ions and applying voltage with the electrode plate, as applying voltage may be perceived as a kind of electric charge supply, then the configuration according to the second embodiment may be understood as the electric charge supply for suppressing (including preventing) the polarization reversal.

Furthermore, according to the research result conducted by the inventor of the present invention, it is turned out that the above mentioned unintentional and random polarization reversal is more likely to occur in a phase when the temperature of the crystal substrate 4 decrease. Therefore, carrying out the process according to the second embodiment in this phase is turned out more effective. It is presumed that the reason why the random polarization reversal is more likely to occur during the temperature decrease is that the niobium (Nb) ion and the lithium (Li) ion in the crystal are more likely to move for pursuing new stable state during the temperature decrease. In any event, when the above mentioned operation for suppressing the polarization reversal during the temperature decrease, the desirable effect may be demonstrated in more assured manner.

As such, according to the research result conducted by the inventor of the present invention, it is turned out that the above mentioned unintentional and random polarization reversal is more likely to occur when the temperature changes more significantly. Thus, if the crystal substrate 4 is cooled after a heating process, then naturally cooling the crystal substrate 4 is preferable. According to the experimental result conducted by the inventor of the present invention, the generation of the spot like pattern as shown in FIG. 5 was observed, even if when the crystal substrate 4 is left lying in the heating furnace 9 for a long time as described above. In order to allow the crystal substrate 4 to decrease in temperature with taking further longer time, cooling the crystal substrate 4 with heating (at weaken level of heating) may be conceivable. However, employing such configuration may entail drastically degraded productivity. Avoiding such drawback is another advantageous effect of the method according to the second embodiment.

As seen by comparing FIG. 3 and FIG. 4, while the first embodiment shown in FIG. 3 may suppress the polarization reversal only at one side plane of the crystal substrate 4, the second embodiment shown in FIG. 4 may suppress the polarization reversal at both sides of the crystal substrate 4 by supplying reversed polarity ions. Accordingly, higher effect of suppressing the polarization reversal may be achieved.

Although in FIGS. 3 and 4 shows only one plate of the crystal substrate 4, a plurality of crystal substrates 4 may be simultaneously heat-treated, and a plurality of crystal substrates 4 may be heat-treated while ions being supplied.

For example, in the first embodiment shown in FIG. 3, a plurality of crystal substrates 4 may be aligned on one tray 93, and may be heat-treated and simultaneously supplied with ions by being covered by the covering member 94 including the ionizer 91. In this case, each of the crystal substrates 4 may be arranged such that z planes with same polarity of the crystal substrates 4 face the upper side. Alternatively, it is preferable to arrange the crystal substrates 4 such that +z planes of half of crystal substrates 4 face the upper side and −z planes of another half of crystal substrates 4 face the upper side, because it allows the positive and negative ions can be equally utilized.

Likewise, also in another embodiment shown in FIG. 4, a plurality of crystal substrates 4 may be heat-treated with simultaneously being supplied with ions. For example, a substrate holding member 92 may be a cassette-like member capable of accommodating a plurality of crystal substrates 4. The substrate holding member 92 holds each of the crystal substrates 4 such that the each of the crystal substrates 4 vertically stands and is mutually spaced each other. That is, the main plane of each of the crystal substrates 4 becomes exposed. Similarly, the ionizer 91 is disposed at the upper portion of the heating furnace 9 and allows emitted ions to reach the main plane(s) of each of the crystal substrates 4 to suppress the unintentional polarization reversal.

As described above, it should be noted that holding the crystal substrate 4 with the both main planes of the crystal substrates 4 being exposed has a significance that the polarization reversal may be suppressed at both side by supplying the inverse polarity ions from both side of the main planes of the crystal substrate 4. This significance may be accomplished not only in the case that the crystal substrate 4 is vertically arranged but also in the case that the crystal substrate 4 is arranged differently, for example, horizontally. For example, the crystal substrate 4 may be horizontally arranged, being hold by the holding member at both ends, and then treated (processed) in a hanging state in the air (i.e., a state in which both upper and lower main planes of the crystal substrate 4 are exposed).

Furthermore, it should be noted that allowing the main plane of the crystal substrate 4 to be in parallel to the emitting direction of ions from the ionizer 91 has a significance that the ions may be uniformly yet efficiently supplied to each area of the main planes. This significance may be also accomplished in the case that the crystal substrate 4 is arranged horizontally with being hold in a hanging state in the air. It may be accomplished by arranging the ionizer 91 such that the ionizer 91 irradiates ions towards the horizontal direction.

In the above mentioned embodiments, the insulating layer 5 is configured as a line-and-space shaped pattern 6, the conductive fluid contacts the surface of the crystal substrate 4 that is not covered with the insulating layer pattern 6, and the voltage is applied to the surface of the crystal substrate 4. However, alternatively, another embodiment may be conceivable. In this another embodiment, the conductive layer may be formed on one plane of the crystal substrate 4, a line-and-space shaped pattern may be formed on the conductive layer by the photolithography technique, and then the voltage may be applied to the crystal substrate 4 through the formed line-and-space shaped conductive pattern. When the insulating layer 5 is configured as the line-and-space shaped pattern 6 and the conductive fluid contacts the surface of the crystal substrate 4 that is not covered with the insulating layer patter 6 to apply the voltage to the crystal substrate 4, the manufacturing process may be simplified as it may eliminate the forming process of the conductive pattern and the removing process thereof.

In the above mentioned embodiments, the term "resist" is used to intend to mean that it allows the voltage not to be applied locally during the voltage apply using the conductive fluid. Thus, the resist in the above mentioned embodiments is sufficient to function if it has required insulation property, and having a tolerability against etchant is not necessary. Nevertheless, the insulating material with tolerability against the etchant may be used for the material of the insulating layer 5 according to the above mentioned embodiments.

The pre-bake treatment or post-bake treatment may be also applied to the resist formed during the photolithography for forming the conductive pattern. Generally, these kinds of bake treatments may be carried out in order to improve the anti-etching property and also anti-plasma property when the conductive layer is etched with the resist pattern serving as a mask.

On the other hand, the pre-bake treatment and post-bake treatment in the above mentioned embodiments may be carried out in order to improve the insulation property during the voltage apply using the conductive fluid, or improve the adhesion property to the crystal substrate 4, or both, which is slightly different from the above mentioned general purpose. Accordingly, a condition for applying the pre-bake treatment to the insulating layer 5 or the post-bake treatment to the insulating layer pattern 6 may be different from the condition in the case that the resist pattern is used as an etching mask in many cases.

Although the above mentioned embodiments are described with reciting $LiNbO_3$ as an exemplary non-linear optical crystal material constituting the device, other materials may be employed. For example, $LiTaO_3$ (PPLT), $KTiOPO_4$ (PP-KTP) may be employed for fabricating the device by similar method.

Also, the quasi phase matching (QPM) wavelength conversion device is advantageous in that arbitrarily desired coherent length Λ may be selected by adjusting the polarization reversal pitch (cycle) Λ. Accordingly, the above mentioned embodiments may be applied for the device converting the arbitral wavelength for the purpose other than in the case of generating second harmonic (532 nm) from the infrared light of 1064 nm as described above.

While certain embodiments have been described, these embodiments have been presented by way of example only, and are not intended to limit the scope of the present invention. The novel apparatuses and methods thereof described herein may be embodied in a variety of other forms; furthermore, various omissions, substitutions and changes in the form of the apparatuses and methods thereof described herein may be made without departing from the gist of the present invention. The accompanying claims and their equivalents are intended to cover such forms or modifications as would fall within the scope and gist of the present invention.

The present application is based upon and claims the benefit of a priority from Japanese Patent Application No. 2013-217660, filed on Oct. 18, 2013, and the entire contents of which are incorporated herein by reference.

What is claimed is:

1. A method of fabricating a wavelength conversion device, the device being fabricated from a crystal substrate and having a structure that is periodically polarization-reversed in the direction perpendicular to a thickness direction of the crystal substrate formed from a ferroelectric crystal demonstrating a non-linear optical effect, the method comprising:
 heating the crystal substrate; and
 removing electricity on a surface of the crystal substrate when temperature of the crystal substrate being changing due to the heating, the method further comprising:
 forming an insulating layer on at least one plane of the crystal substrate;
 forming a pattern with line-and-space of the insulating layer; and
 periodically applying voltage to the crystal substrate using the formed pattern with line-and-space of the insulating layer, wherein
 the heating is carried out after the forming the insulating layer, and before or after the forming the pattern.

2. The method of fabricating a wavelength conversion device according to claim 1 wherein
 the removing electricity is carried out by collecting, on the surface of the crystal substrate, ions having a polarity different from a polarity on a region of the surface of the crystal substrate in which natural polarization occurs.

3. The method of fabricating a wavelength conversion device according to claim 2 wherein
 the removing electricity is carried out by use of an ionizer.

4. The method of fabricating a wavelength conversion device according to claim 3, the applying voltage further comprising:
 supplying conductive fluid to the crystal substrate in a manner that the conductive fluid contacts a region of the surface of the crystal substrate that is not covered with the insulating layer, the region consisting of each of linear portions constituting the line-and-space; and
 applying the voltage to the crystal substrate through the conductive fluid.

5. The method of fabricating a wavelength conversion device according to claim 3, wherein
 the heating is carried out after forming the insulating layer.

6. The method of fabricating a wavelength conversion device according to claim 3, wherein
 the removing electricity is carried out when the temperature of the crystal substrate decreases.

7. A wavelength conversion device fabricated by the method of fabricating a wavelength conversion device according to claim 3.

8. The method of fabricating a wavelength conversion device according to claim 2, the applying voltage further comprising:
 supplying conductive fluid to the crystal substrate in a manner that the conductive fluid contacts a region of the surface of the crystal substrate that is not covered with the insulating layer, the region consisting of each of linear portions constituting the line-and-space; and
 applying the voltage to the crystal substrate through the conductive fluid.

9. The method of fabricating a wavelength conversion device according to claim 2, wherein
 the heating is carried out after forming the insulating layer.

10. The method of fabricating a wavelength conversion device according to claim 2, wherein
 the removing electricity is carried out when the temperature of the crystal substrate decreases.

11. A wavelength conversion device fabricated by the method of fabricating a wavelength conversion device according to claim 2.

12. The method of fabricating a wavelength conversion device according to claim 1, the applying voltage further comprising:
 supplying conductive fluid to the crystal substrate in a manner that the conductive fluid contacts a region of the surface of the crystal substrate that is not covered with the insulating layer, the region consisting of each of linear portions constituting the line-and-space; and
 applying the voltage to the crystal substrate through the conductive fluid.

13. The method of fabricating a wavelength conversion device according to claim 12, wherein
 the removing electricity is carried out when the temperature of the crystal substrate decreases.

14. A wavelength conversion device fabricated by the method of fabricating a wavelength conversion device according to claim 12.

15. The method of fabricating a wavelength conversion device according to claim 1, wherein
 the heating is carried out after forming the insulating layer.

16. The method of fabricating a wavelength conversion device according to claim 1, wherein
 the removing electricity is carried out when the temperature of the crystal substrate decreases.

17. A wavelength conversion device fabricated by the method of fabricating a wavelength conversion device according to claim 1.

* * * * *